US012355009B2

(12) United States Patent
Chew et al.

(10) Patent No.: US 12,355,009 B2
(45) Date of Patent: Jul. 8, 2025

(54) LOW STRESS ASYMMETRIC DUAL SIDE MODULE

(71) Applicant: SEMICONDUCTOR COMPONENTS INDUSTRIES, LLC, Scottsdale, AZ (US)

(72) Inventors: Chee Hiong Chew, Seremban (MY); Atapol Prajuckamol, Thanyaburi (TH); Stephen St. Germain, Gilbert, AZ (US); Yusheng Lin, Phoenix, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 18/398,589

(22) Filed: Dec. 28, 2023

(65) Prior Publication Data

US 2024/0128240 A1   Apr. 18, 2024

Related U.S. Application Data

(63) Continuation of application No. 17/823,149, filed on Aug. 30, 2022, now Pat. No. 11,894,347, which is a continuation of application No. 16/678,039, filed on Nov. 8, 2019, now Pat. No. 11,462,515.

(60) Provisional application No. 62/882,119, filed on Aug. 2, 2019.

(51) Int. Cl.
| | |
|---|---|
| *H01L 25/07* | (2006.01) |
| *H01L 23/00* | (2006.01) |
| *H01L 23/367* | (2006.01) |
| *H01L 25/00* | (2006.01) |

(52) U.S. Cl.
CPC .......... *H01L 25/071* (2013.01); *H01L 23/367* (2013.01); *H01L 24/32* (2013.01); *H01L 25/50* (2013.01); *H01L 2224/32245* (2013.01)

(58) Field of Classification Search
CPC ..... H01L 25/071; H01L 23/367; H01L 24/32; H01L 2224/32245
See application file for complete search history.

(56) References Cited

U.S. PATENT DOCUMENTS

| | | | | |
|---|---|---|---|---|
| 4,763,188 A | * | 8/1988 | Johnson | H01L 23/3107 |
| | | | | 174/544 |
| 5,615,475 A | * | 4/1997 | Burns | H01L 23/4951 |
| | | | | 257/E23.092 |
| 6,175,149 B1 | * | 1/2001 | Akram | H01L 24/32 |
| | | | | 257/676 |

(Continued)

*Primary Examiner* — Eugene Lee
(74) *Attorney, Agent, or Firm* — IPTechLaw

(57) ABSTRACT

Implementations of semiconductor packages may include: a first substrate having two or more die coupled to a first side, a clip coupled to each of the two or more die on the first substrate and a second substrate having two or more die coupled to a first side of the second substrate. A clip may be coupled to each of the two or more die on the second substrate. The package may include two or more spacers coupled to the first side of the first substrate and a lead frame between the first substrate and the second substrate and a molding compound. A second side of each of the first substrate and the second substrate may be exposed through the molding compound. A perimeter of the first substrate and a perimeter of the second substrate may not fully overlap when coupled through the two or more spacers.

20 Claims, 11 Drawing Sheets

(56) References Cited

U.S. PATENT DOCUMENTS

| | | | |
|---|---|---|---|
| 6,239,496 B1* | 5/2001 | Asada | H01L 21/6836 |
| | | | 257/E21.503 |
| 6,545,345 B1* | 4/2003 | Glenn | H05K 1/182 |
| | | | 257/676 |
| 7,468,553 B2* | 12/2008 | Szewerenko | H01L 24/48 |
| | | | 257/E23.18 |
| 7,517,733 B2* | 4/2009 | Camacho | H01L 23/49811 |
| | | | 438/123 |
| 7,612,434 B2* | 11/2009 | Imaizumi | H01L 23/49531 |
| | | | 257/686 |
| 7,692,279 B2* | 4/2010 | Karnezos | H01L 25/0652 |
| | | | 257/784 |
| 9,275,926 B2 | 3/2016 | Hable et al. | |
| 9,390,996 B2 | 7/2016 | Jeon | |
| 10,002,821 B1 | 6/2018 | Hoegerl | |
| 10,418,313 B2 | 9/2019 | Fuergut et al. | |
| 11,462,515 B2* | 10/2022 | Chew | H01L 24/40 |
| 11,469,163 B2* | 10/2022 | Chew | H01L 23/49575 |
| 11,830,856 B2* | 11/2023 | Chew | H01L 25/18 |
| 11,894,347 B2* | 2/2024 | Chew | H01L 25/50 |
| 11,908,840 B2* | 2/2024 | Chew | H01L 25/071 |
| 11,948,870 B2* | 4/2024 | Chew | H01L 23/3735 |
| 11,955,412 B2* | 4/2024 | Chew | H01L 24/80 |
| 2002/0005575 A1* | 1/2002 | Park | H01L 23/49537 |
| | | | 257/E23.042 |
| 2004/0222515 A1 | 11/2004 | Choi et al. | |
| 2007/0057284 A1 | 3/2007 | Casey et al. | |
| 2008/0054425 A1 | 3/2008 | Malhan et al. | |
| 2008/0230928 A1* | 9/2008 | Otremba | H01L 23/4952 |
| | | | 257/784 |
| 2009/0108467 A1* | 4/2009 | Otremba | H01L 25/18 |
| | | | 438/109 |
| 2009/0116197 A1 | 5/2009 | Funakoshi et al. | |
| 2011/0057713 A1* | 3/2011 | Kawanami | H01L 25/16 |
| | | | 361/728 |
| 2012/0307541 A1* | 12/2012 | Shimoike | H01L 24/92 |
| | | | 438/121 |
| 2013/0270687 A1 | 10/2013 | Kim et al. | |
| 2013/0270689 A1 | 10/2013 | Kim et al. | |
| 2014/0159216 A1 | 6/2014 | Ishino et al. | |
| 2015/0179611 A1 | 6/2015 | Lu et al. | |
| 2016/0064308 A1 | 3/2016 | Yamada | |
| 2017/0062316 A1* | 3/2017 | Mukhopadhyay | H01L 23/373 |
| 2017/0117209 A1* | 4/2017 | Benedikt | H01L 24/84 |
| 2017/0287875 A1* | 10/2017 | Gao | H01L 21/486 |
| 2018/0082921 A1* | 3/2018 | Grassmann | H01L 23/49575 |
| 2018/0122720 A1* | 5/2018 | Hable | H01L 23/3121 |
| 2018/0145007 A1 | 5/2018 | Hatano et al. | |
| 2018/0166415 A1* | 6/2018 | Khaselev | H01L 24/38 |
| 2018/0240731 A1* | 8/2018 | Choi | H01L 23/4334 |
| 2020/0194364 A1 | 6/2020 | Duran et al. | |

* cited by examiner

LOW STRESS ASYMMETRIC DUAL SIDE MODULE

CROSS REFERENCE TO RELATED APPLICATIONS

This application is a continuation application of the earlier U.S. Utility Patent Application to Chew et al., entitled "Low Stress Asymmetric Dual Side Module," application Ser. No. 17/823,149, filed Aug. 30, 2022, now pending, which application is a continuation application of U.S. Utility Patent Application to Chew et al., entitled "Low Stress Asymmetric Dual Side Module," application Ser. No. 16/678,039, filed Nov. 8, 2019, now issued as U.S. Pat. No. 11,462,515, which application claims the benefit of the filing date of U.S. Provisional Patent Application 62/882,119, entitled "Low Stress Asymmetric Dual Side Module" to Chew et al., which was filed on Aug. 2, 2019, the disclosures of each of which are hereby incorporated entirely herein by reference.

BACKGROUND

1. Technical Field

Aspects of this document relate generally to modular semiconductor packages, such as power semiconductor packages having dual side cooling capabilities. More specific implementations involve lead frames.

2. Background

Power semiconductor packages generally include multiple stacked substrates. Heat sinks may be coupled to an external terminal of the device. Some power semiconductor packages may include a heat sink with a fin-array structure.

SUMMARY

Implementations of semiconductor packages may include: a first substrate having two or more die coupled to a first side of the first substrate. A clip may be coupled to each of the two or more die on the first substrate. The package may also include a second substrate having two or more die coupled to a first side of the second substrate. A clip may be coupled to each of the two or more die on the second substrate. The package may include two or more spacers coupled to the first side of the first substrate. The package may also include a lead frame between the first substrate and the second substrate and a molding compound encapsulating the lead frame. A second side of each of the first substrate and the second substrate may be exposed through the molding compound. A perimeter of the first substrate and a perimeter of the second substrate may not fully overlap when coupled through the two or more spacers.

Implementations of semiconductor packages may include one, all, or any of the following:

The two or more die may include an insulated-gate bipolar transistors (IGBT) die and a fast recovery die (FRD).

The first substrate and the second substrate may include a direct bonded copper substrate (DBC) with an alumina ($Al_2O_3$) ceramic doped with zirconium dioxide ($ZrO_2$), a silicon nitride ($Si_3N_4$) ceramic, an aluminum nitride (AlN) ceramic, a high strength AlN (H—AlN) ceramic, or any combination thereof.

The semiconductor package may also include a heat sink coupled with the second side of the first die, the second side of the second die, or any combination thereof.

The two or more spacers may be made of electrically conductive material and may electrically couple the first substrate to the second substrate.

The first substrate and the second substrate may include a direct bonded copper substrate (DBC), an insulated metal substrate technology (IMST) substrate, an active metal bonding (AMB) substrate, or any combination thereof.

Implementations of semiconductor packages may include: a lead frame and a first substrate mechanically and electrically coupled to a first side of the lead frame. The first substrate may include two or more die on the first side of the first substrate. A clip may be coupled to each of the two or more die coupled to the first side of the first substrate. The package may also include a second substrate mechanically and electrically coupled to a second side of the lead frame. The second substrate may include two or more die on the first side of the second substrate and a clip is coupled to each of the two or more die. The package may also include two or more spacers coupled to the first side of each of the first substrate and the second substrate. A molding compound may encapsulate the first side and the second side of the lead frame. The first side of the first substrate and the first side of the second substrate may be asymmetrically coupled through the two or more spacers.

Implementations of semiconductor packages may include one, all, or any of the following:

The two or more die may include an insulated-gate bipolar transistors (IGBT) die and a fast recovery die (FRD).

The first substrate and the second substrate may include a direct bonded copper substrate (DBC) with an alumina ($Al_2O_3$) ceramic doped with zirconium dioxide ($ZrO_2$) a silicon nitride ($Si_3N_4$) ceramic, an aluminum nitride (AlN) ceramic, a high strength AlN (H—AlN) ceramic, or any combination thereof.

The package may also include a heat sink coupled with one of the second side of the first die, the second side of the second die, or any combination thereof.

The two or more spacers may be made of electrically conductive material and electrically couple the first substrate to the second substrate.

The first substrate and the second substrate may include a direct bonded copper substrate (DBC), an insulated metal substrate technology (IMST) substrate, an active metal bonding (AMB) substrate, or any combination thereof.

Implementations of semiconductor packages may be manufactured through methods of forming semiconductor packages. Various method implementations may include: providing a first panel of first substrates and a second panel of second substrates. The method may also include printing a first electrically conductive bonding material on the first side of the first panel of substrates and the second side of the first panel of substrates in predetermined locations and coupling two or more die to each substrate of the first panel of substrates and to each substrate of the second panel of substrates at the predetermined locations. The method may also include dispensing a second electrically conductive material onto a second side of each of the two or more die and coupling a clip to each of the two or more die. The method may include singulating each of the first panel and the second panel into a plurality of first substrates and a plurality of second substrates, respectively. The method may include dispensing solder onto a plurality of predetermined locations on the first side of each of the plurality of first substrates and each of the plurality of second substrates. The method may also include coupling a first substrate of the plurality of first substrates to a first side of a lead frame and coupling two or more spacers to a first side of the first substrate. The method may also include coupling a first side of a second substrate of the plurality of second substrates to the two or more spacers and to the second side of the lead frame.

Implementations of methods of forming semiconductor packages may include one, all, or any of the following:

The method may further include trimming the lead frame to expose a plurality of leads and forming the leads.

The method may further include encapsulating the lead frame on the first side and the second side, wherein a second side of each substrate of the plurality of first substrates and the plurality of second substrates is exposed.

The first panel of first substrates and the second pane of second substrates may each include a direct bonded copper substrate (DBC), an insulated metal substrate technology (IMST) substrate, an active metal bonding (AMB) substrate, or any combination thereof.

The method may further include coupling a heat sink with one of the second side of the first die, the second side of the second die, or any combination thereof.

The method may further include coupling a heat sink with the second side of the first substrate of the plurality of first substrates, the second side of the second substrate of the plurality of second substrates, or any combination thereof.

The two or more spacers may be made of electrically conductive material and may electrically couple the first substrate to the second substrate.

The first side of the first substrate and the first side of the second substrate may be asymmetrically coupled through the two or more spacers.

The first electrically conductive material and the second electrically conductive material may include a solder paste or a sintering paste.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
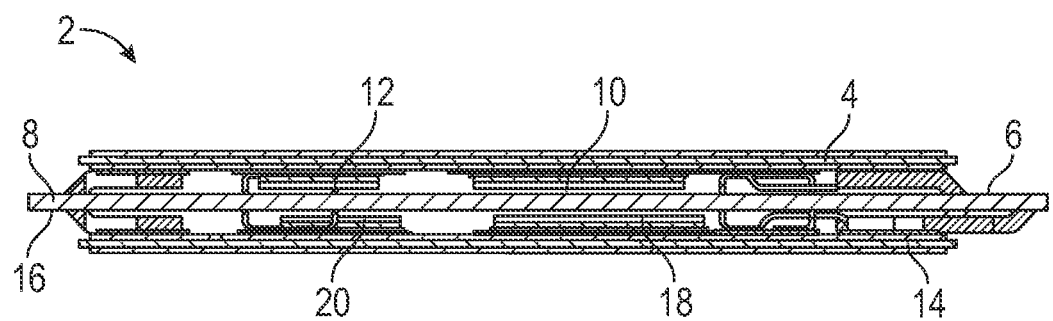
FIG. 1 is a side view of an implementation of a semiconductor package.

Referring to FIG. 1, a side view of an implementation of a semiconductor package 2 is illustrated. As illustrated, the semiconductor package includes a first substrate 4 coupled to a first side 6 of a lead frame 8. The first substrate 4 includes two die 10 and 12 coupled to the first substrate 4 in two predetermined locations. In various implementations, more than two die may be coupled to the first substrate. By non-limiting example, the die may include an insulated-gate bipolar transistor (IGBT), a fast recovery die (FRD), any other semiconductor die, or any combination thereof. The semiconductor package also includes a second substrate 14 coupled to a second side 16 of the lead frame 8. The lead frame 8 is coupled between the first substrate 4 and the second substrate 14. The second substrate has two die 18 and 20 coupled to two predetermined locations on a first side of the second substrate. In various implementations, the two die coupled to the second substrate may include, by non-limiting example, an insulated-gate bipolar transistors (IGBT), a fast recovery die (FRD), any other semiconductor die, or any combination thereof.

Each of the first substrate and the second substrate illustrated in FIG. 1 is a direct bonded copper substrate (DBC)

including a ceramic substrate with a copper plate coupled to a first side and a second side of the ceramic substrate. In various implementations, the DBC may include an alumina ($Al_2O_3$) ceramic doped with zirconium dioxide ($ZrO_2$) (HPS). In other implementations, the ceramic may be made of other materials such as a silicon nitride ($Si_3N_4$) ceramic, an aluminum nitride (AlN) ceramic, a high strength AlN (H—AlN) ceramic, or any combination thereof. In some implementations, a thickness of the layers of the Cu/HPS/Cu DBC substrate may include 0.30 mm Cu, 0.32 mm ceramic/HPS, and 0.30 mm Cu. In other implementations, the thickness may be changed based on electrical needs, thermal needs, package height control, and other parameters of the device. In other implementations, either the first substrate, the second substrate, or both the first substrate and the second substrate may be made of another substrate material, such as, by non-limiting example, an active metal brazed (AMB) substrate, an insulated metal substrate technology (IMST), a laminated substrate, a substrate with a metal layer on only one surface of the substrate, any combination thereof, and any other substrate type.

Figure 2:
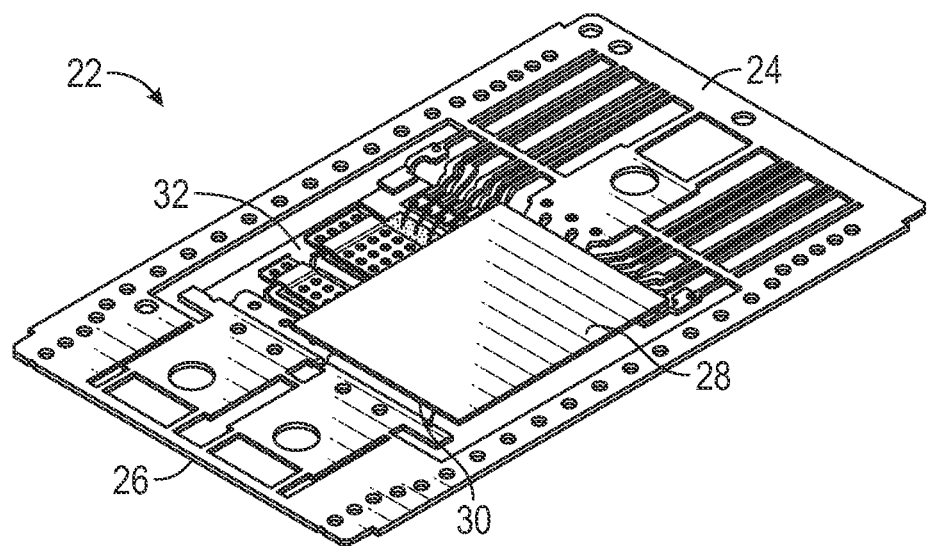
FIG. 2 is a top perspective view of an implementation of a semiconductor package.

Referring to FIG. 2, a top view of an implementation of a semiconductor package 22 is illustrated. In this view, a second side 24 of the lead frame is illustrated having a second substrate 28 coupled thereto. The second substrate 28 may be coupled to the lead frame 24 through leads 30 formed in an up position. As illustrated, a first substrate 32 is coupled to a first side 26 of the lead frame opposite the second substrate. A portion of the first side of the first substrate 32 is facing a portion, but not all of the first side of the second substrate. Also, as illustrated, a perimeter of the first substrate and a perimeter of a second substrate do not fully overlap when coupled to the lead frame and spacers. The first substrate and the second substrate are accordingly asymmetrically coupled to the lead frame.

Figure 3:
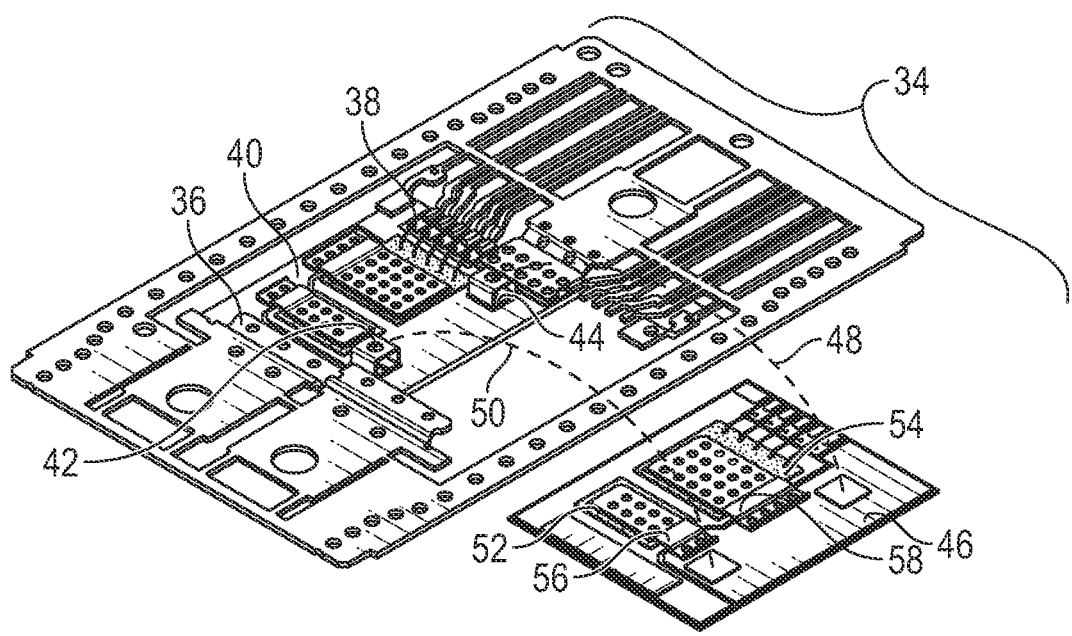
FIG. 3 is a top perspective view of an implementation of a lead frame before coupling of a second substrate thereto.

Referring to FIG. 3, an implementation of a lead frame 34 is illustrated. The lead frame may be formed through stamping of the leads to offset contacts with a first substrate and a second substrate. A first substrate 40 is coupled to a first side of the lead frame 34 through leads 36 and wire bonds 38. In various implementations, the lead frame may be coupled to the first substrate through other electrically conductive materials such as solders or die attach materials. The first substrate includes two clips coupled to a first side of the first substrate through electrically conductive bonding material. In various implementations, the electrically conductive bonding material may include, by non-limiting example, lead (Pb) free solder paste, silver sintering paste, other electrically conductive bonding materials, or any combination thereof. The two spacers 42 and 44 may be formed of an electrically conductive material(s) and may provide electrical contact between the first substrate and the second substrate. In various implementations, the spacers may be formed of copper or a copper alloy.

As illustrated in FIG. 3, a first side of a second substrate 46 is coupled to the device through leads on the lead frame and through the two spacers 42 and 44 as illustrated by the dotted lines 48 and 50. The second substrate includes two semiconductor die 52 and 54 coupled to a first side of the substrate through electrically conductive material. In various implementations, the two die may include IGBTs, FRDs, or any other die described herein. Clips 56 and 58 are coupled to a first side of each of the two die. In various implementations, the clips may have a thickness of about 0.3 mm. In other implementations, the thickness of the clip may be different based on electrical needs, thermal needs, or other design parameters of the device. In various implementations, the clips may be formed of copper or a copper alloy.

Figure 4:
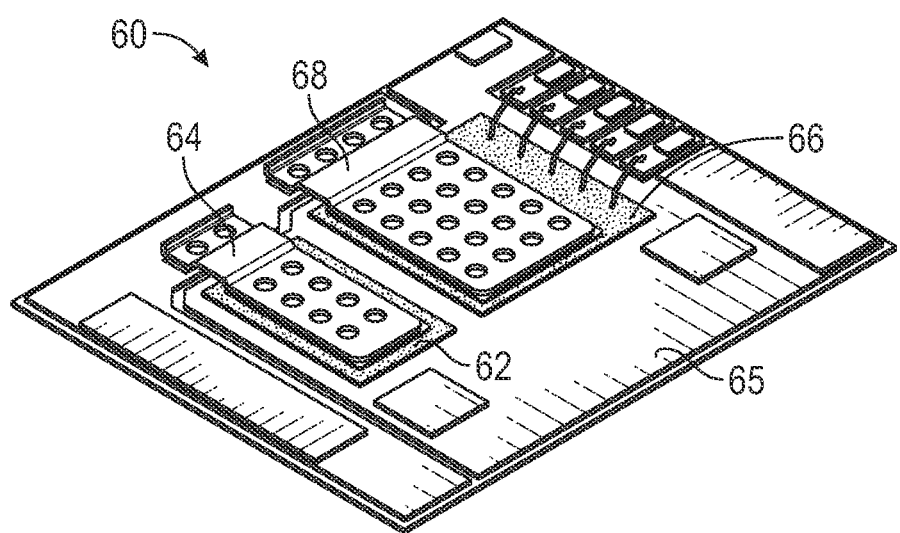
FIG. 4 is a top perspective view of an implementation of a first substrate.

Referring to FIG. 4, an implementation of a first substrate 60 is illustrated. In various implementations, the first substrate may include a direct bonded copper substrate. In various implementations, the thickness of the layers of the substrate may be about 0.30 mm Cu, about 0.32 mm ceramic, and about 0.30 mm Cu. In some implementations, the thicknesses of the layers may be different based on the parameters/structure of the device. The first substrate 60 includes a first die 62 coupled to a first side 65 of the substrate. A clip 64 is coupled to a first side of the first die 62. In various implementations, the first die may be a FRD die. As illustrated, the first substrate 60 also includes a second die 66 coupled to a first side 65 of the first substrate 60. In some implementations, the second die may include an IGBT die. A clip 68 is coupled to a first side of the second die 66 through electrically conductive material. In various implementations, the clips may be formed from copper, a copper alloy, or another electrically conductive material.

Figure 5:
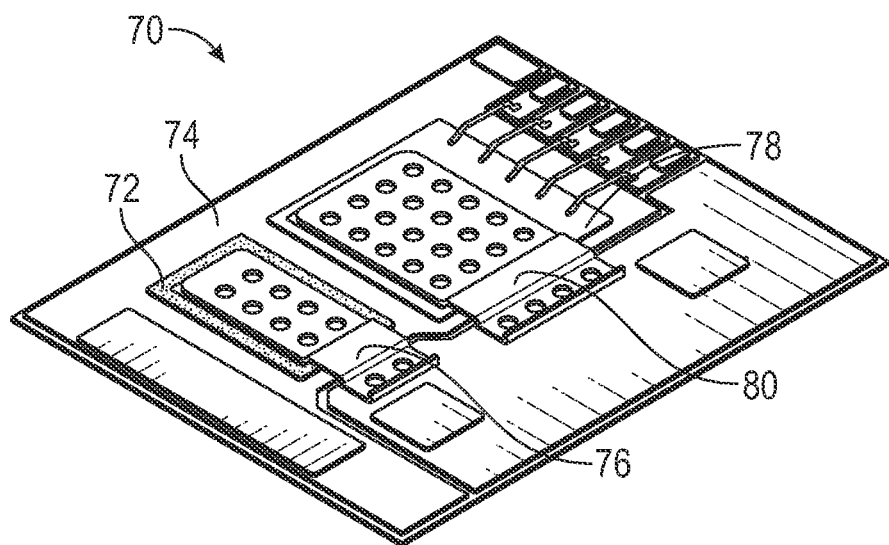
FIG. 5 is a top perspective view of an implementation of a second substrate.

Referring to FIG. 5, an implementation of a second substrate 70 is illustrated. In various implementations, the second substrate may include a direct bonded copper (DBC) substrate. In some implementations, the DBC may include an alumina ($Al_2O_3$) ceramic doped with zirconium dioxide ($ZrO_2$) or any other combination described herein. The second substrate 70 includes a first die 72 coupled to a first side 74 of the substrate. In various implementations, the first die may be a FRD die. As illustrated, a clip 76 is coupled to a first side of the first die 72. In various implementations, the clip may be formed of copper, a copper alloy, or any other materials described for the clip herein. In various implementations, the clip may have a thickness of about 0.3 mm. In other implementations, the thickness of the clip may be larger or smaller depending on electrical and thermal needs of the device. As illustrated, the second substrate 70 also includes a second die 78 coupled to a first side 74 of the second substrate 70. In some implementations, the second die may include an IGBT die. A clip 80 is coupled to a first side of the second die 78 through electrically conductive material. In various implementations, the electrically conductive material coupling the clips to the die may be high temperature solder or high temperature sintering paste. The solder and the sintering paste may include any die bonding or electrically coupling material types described herein. When comparing FIG. 4, the first substrate 60, with FIG. 5, the second substrate 70, it should be noted that the clips have different orientations on each substrate. This difference in orientation may help to offset the substrates when coupled to the lead frame.

Figure 6:
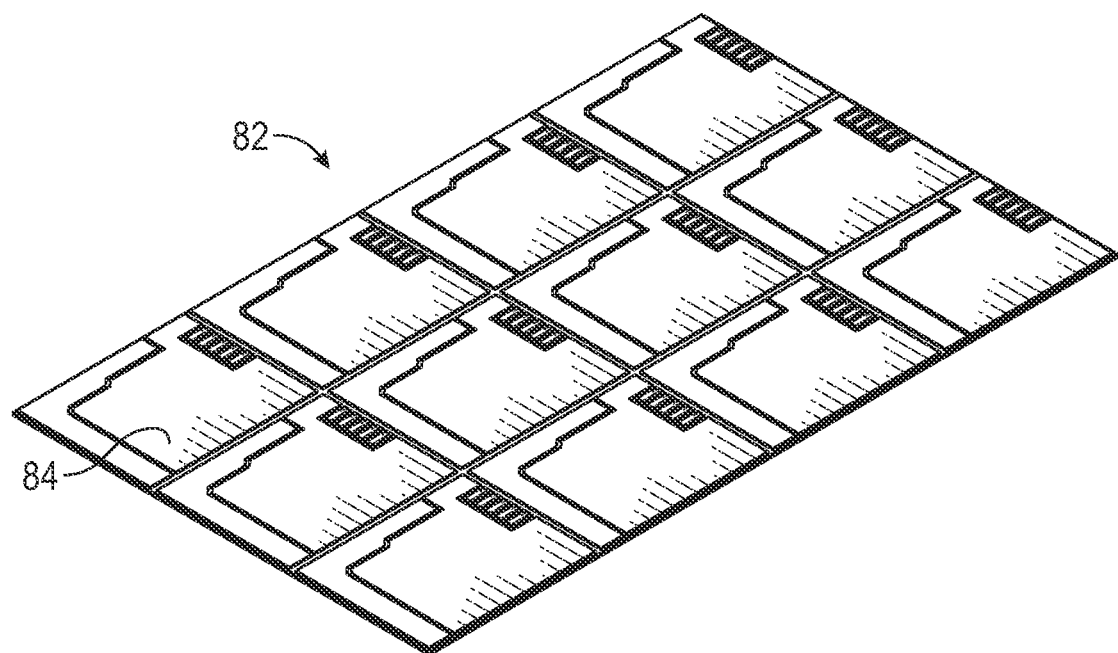
FIG. 6 is a top perspective view of an implementation of a panel of substrates.

Semiconductor packages as described herein may be manufactured through various implementations of a method of forming semiconductor packages. The method may include providing a panel of first substrates. The method may include module sub assembly (MSA) in panel form including two sets of panels, a first panel of first substrates and a second panel of second substrates. Referring to FIG. 6, a panel 82 of a plurality of first substrates 84 is illustrated. The method may also include providing a panel of a plurality of second substrates. For ease of illustration, only a panel of first substrates is illustrated though the method of preparing the panel of second substrates is similar. Referring again to FIGS. 4 and 5, the first substrates 60 and the second substrates 70 do have slightly different orientations and positions in the coupling of the clips and the coupling of electrically conductive material to the first side of each substrate. Each of the first substrates and the second substrates may include DBC substrates. In various implementations, the initial thickness of each of the layers of a substrate may include about 0.30 mm Cu, about 0.32 mm ceramic, and about 0.30 mm Cu. In some implementations, the ceramic layer may include an $Al_2O_3$ ceramic doped with $ZrO_2$. In other implementations, the ceramic layer may include a silicon nitride ($Si_3N_4$) ceramic, an aluminum nitride (AlN) ceramic, a high strength AlN (H—AlN) ceramic, or any combination thereof. In still other implementations, the first substrate and the second substrate may include an insulated metal substrate technology (IMST), an active metal brazed (AMB) substrate, or any other substrate mentioned herein.

Figure 7:
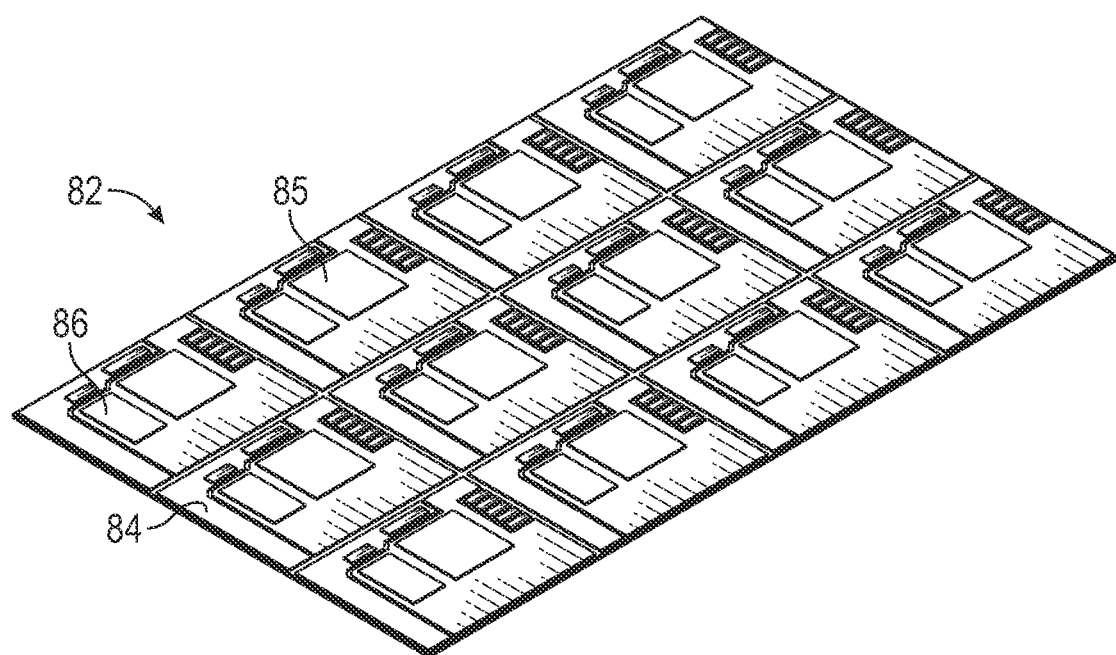
FIG. 7 is a top perspective view of an implementation of a panel of substrates having electrically conductive material coupled in predetermined locations.

The method may also include printing a first electrically conductive bonding material on the first side of each of the first panel of substrates and the second panel of substrates in predetermined locations. In various implementations, the electrically conductive material may include a high temperature solder or a high temperature sintering paste. In some implementations, the solder may be a lead free solder such as $SnAg_{3.5}$ including 96.5% tin (Sn) and 3.5% silver (Ag) or SAC305 including 96.5% Sn, 3% Ag, and 0.5% copper (Cu). In other implementations, the electrically conductive bonding material may include a silver sintering paste. Referring to FIG. 7, a first panel of substrates 82 is illustrated after coupling of the electrically conductive material 85 in the predetermined locations 86 to each of the plurality of first substrates 88.

Figure 8:
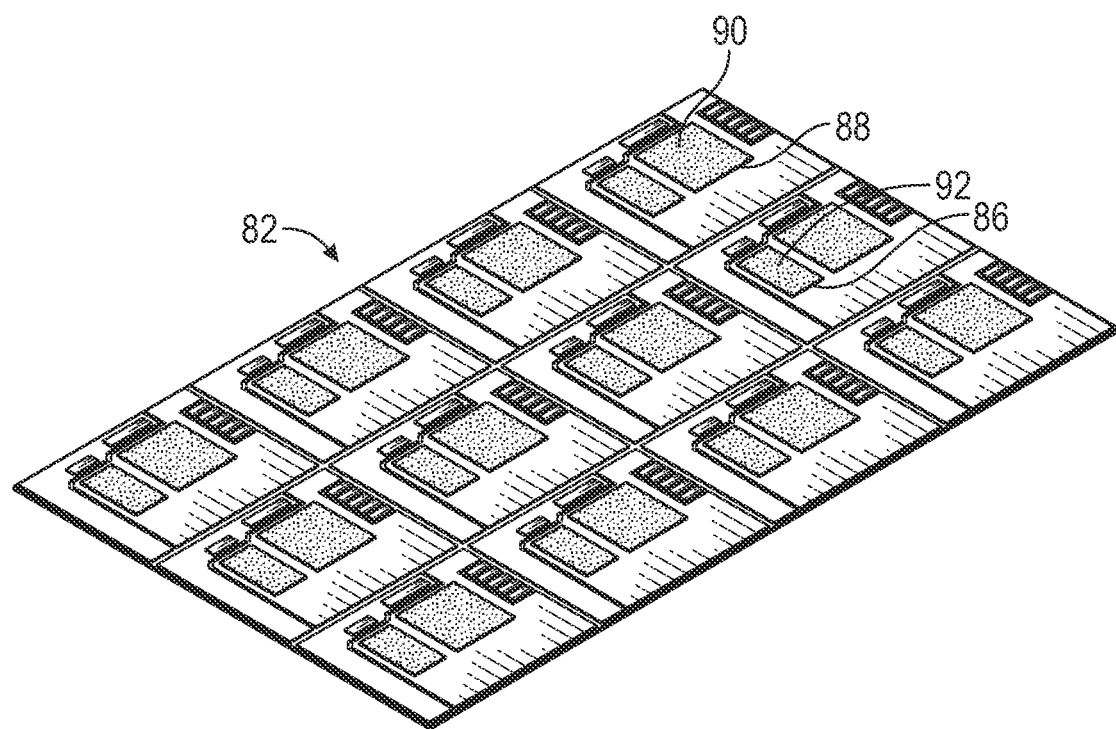
FIG. 8 is a top perspective view of an implementation of a panel of substrates having two die coupled to predetermined locations.
Figure 9:
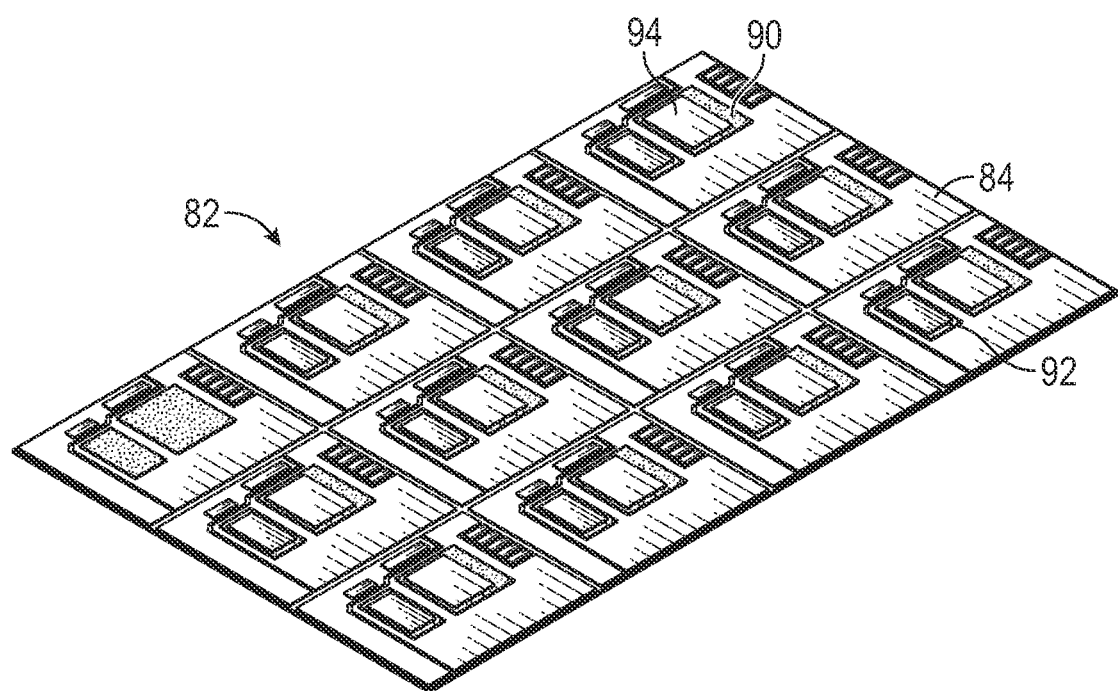
FIG. 9 is a top perspective view of an implementation of electrically conductive material coupled to each of the two die.

The method may also include coupling two or more die to each of the first panel of substrates and the second panel of substrates. The two or more die may be coupled to the substrates in the predetermined locations of the electrically conductive bonding material. In various implementations, the die may include IGBTs, FRDs, or any other semiconductor die described herein. Referring to FIG. 8, a panel 82 of substrates 84 is illustrated after coupling two die 90 and 92 to each of the two predetermined locations 86 and 88. The method may also include dispensing a second electrically conductive material onto a second side or exposed surface of the each of the two or more die. In various implementations, the second electrically conductive material may be the same material printed onto a first side of the substrate or any other electrically conductive material disclosed in this document. Referring to FIG. 9, the panel 82 of substrates 84 is illustrated after dispensing the second electrically conductive material 94 onto the second side of each of the two die 90 and 92.

Figure 10:
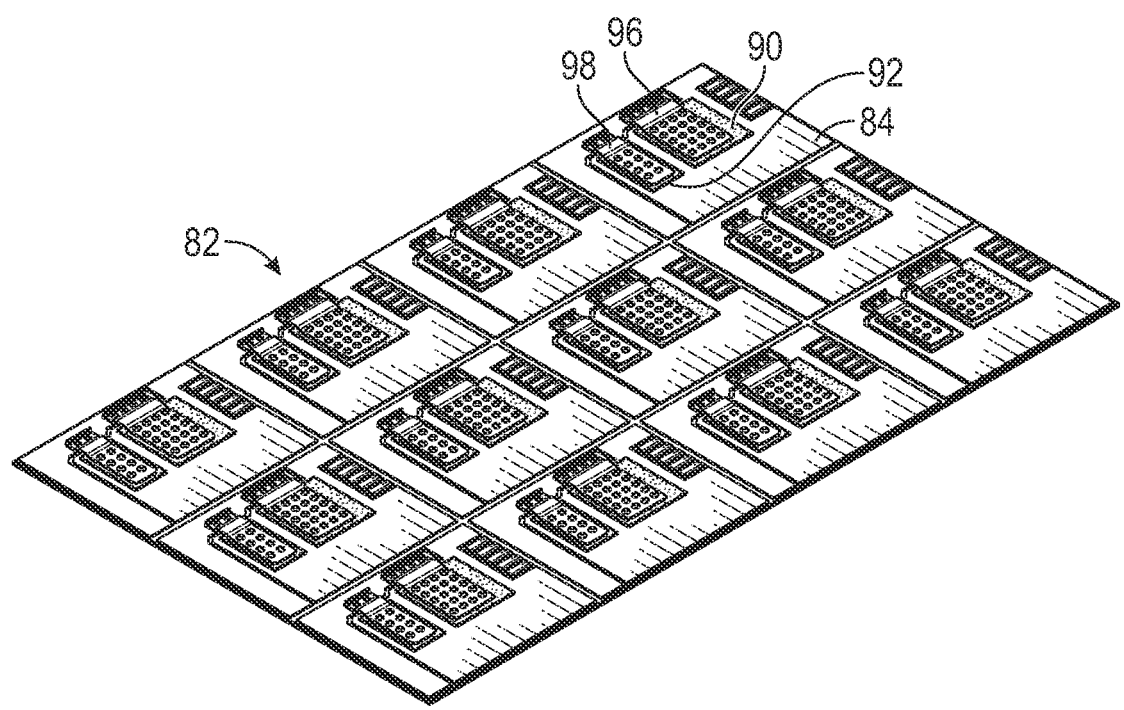
FIG. 10 is a top perspective view of an implementation of two clips coupled to each of the two die.
Figure 11:
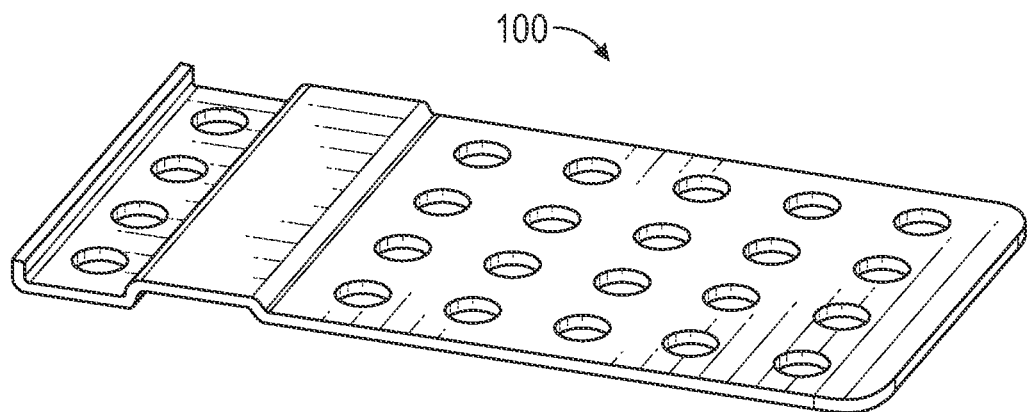
FIG. 11 is a top perspective view of an implementation of a clip.

The method may further include coupling a clip to each of the two or more die through the second electrically conductive material. In some implementations, the clips may be coupled to the die through pressured sintering. Referring to FIG. 10, the panel 82 of substrates 84 is illustrated after the clips 96 and 98 have been coupled to the die 90 and 92 through the electrically conductive material. Various implementations of this method may allow for uniform pressure to be applied to the substrates since clips are mounted prior to assembly in a semiconductor package. As illustrated, the clips are placed perpendicularly to the leads of the lead frame. Referring to FIG. 11, an implementation of a clip is illustrated. In various implementations, the clips may have a thickness of about 0.3 mm, though in other implementations, the thickness of the clips may be larger or smaller based on the electrical or thermal needs of the device. The clips may be flexible in various implementations for similar sized die, which may reduce stress on the die. In some implementations, the clips may be formed from copper or a copper alloy.

Figure 12:
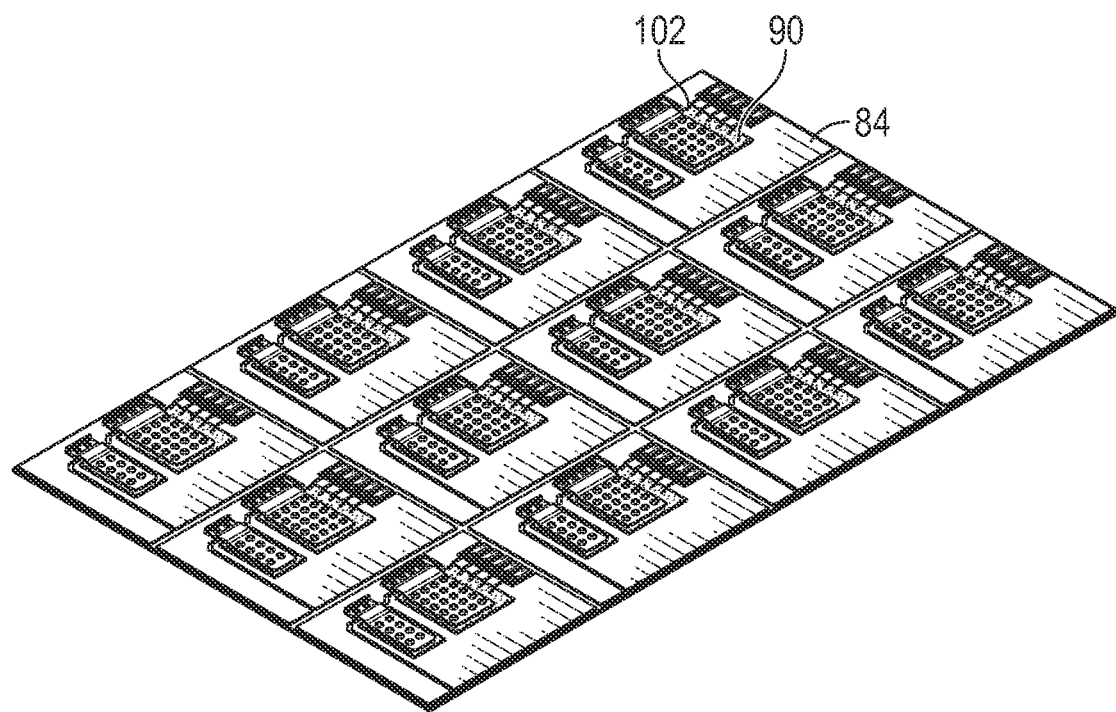
FIG. 12 is a top perspective view of an implementation of wire bonds coupled to the two die.

The method may further include reflowing the solder or sintering paste and flux cleaning of the surface of the substrates. The method may then include electrically coupling the two or more die to each of the plurality of first substrates and the plurality of second substrates. As illustrated in FIG. 12, the die 90 may be coupled to the substrates 88 through wire bonds 102. In various implementations, the wire bonds may be formed of aluminum or other electrically conductive material. While the use of wirebonds is illustrated in FIG. 12, in other implementations, other electrical connectors may be used to connect the clips, such as, by non-limiting example, bumps, stud bumps, pillars, or any other electrical connector type.

Figure 13:
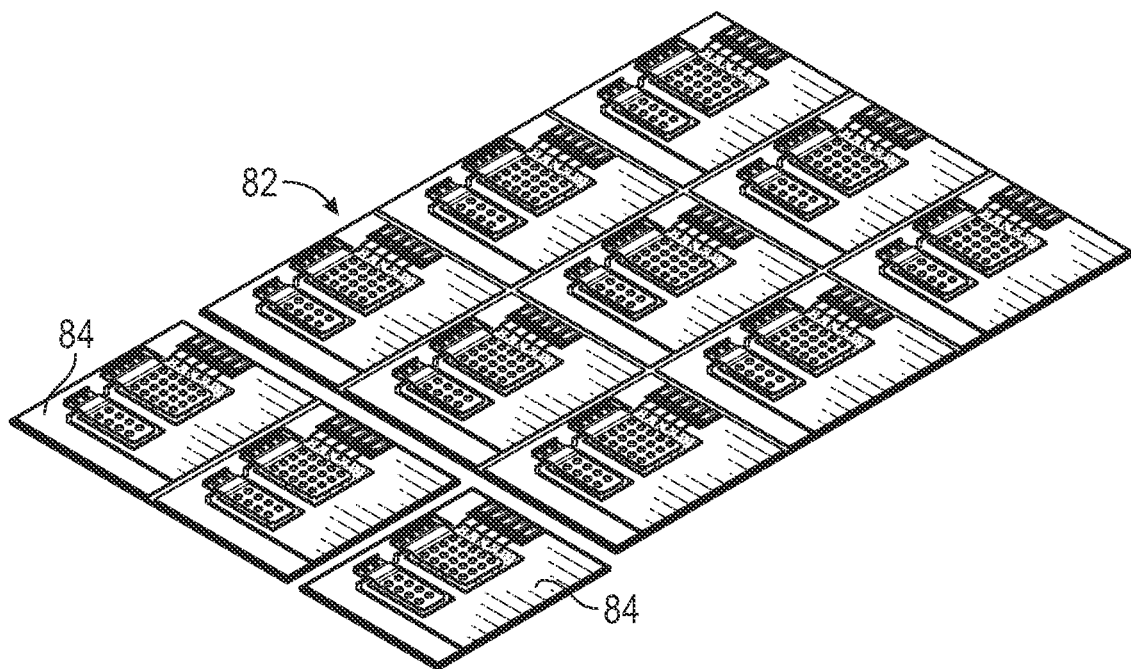
FIG. 13 is a top perspective view of an implementation of a panel of substrates with three substrates singulated therefrom.

The method may also include singulating the first panel of substrates and the second panel of substrates each into a plurality of first substrates and second substrates. In various implementations, the panels of substrates may have scoring lines between each of the plurality of substrates (or may be first scored to form such lines using a stylus) and the substrates may be singulated through breaking on the scored lines. In other implementations, the plurality of substrates may be singulated through laser cutting. In still other implementations, the panels may be singulated into a plurality of substrates through sawing. Referring to FIG. 13, the panel 82 is illustrated after some of the plurality of substrates 84 have been singulated from the panel. In various implementations, each of the substrates may be probe tested prior to singulation or after singulation and before coupling the substrates to the lead frames.

Figure 14:
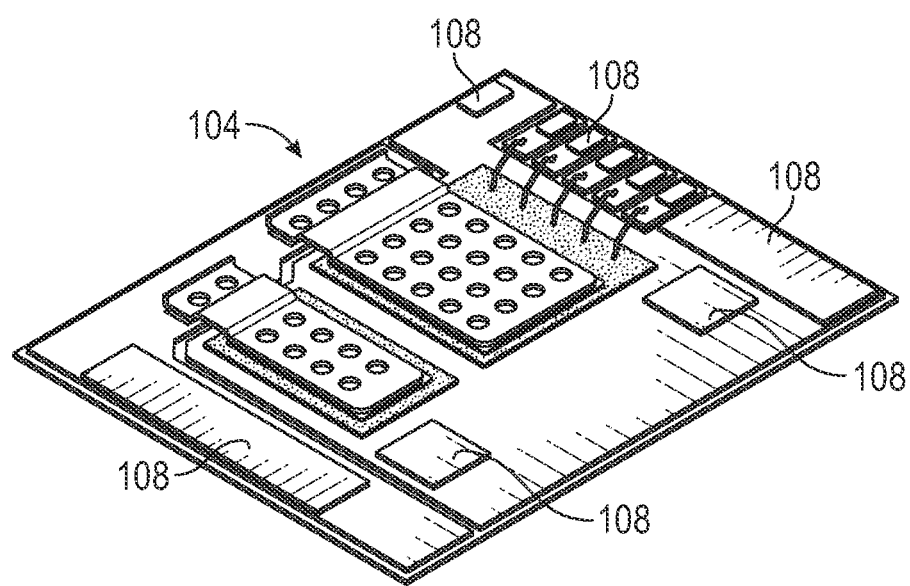
FIG. 14 is a top perspective view of an implementation of a first substrate after singulation.
Figure 15:
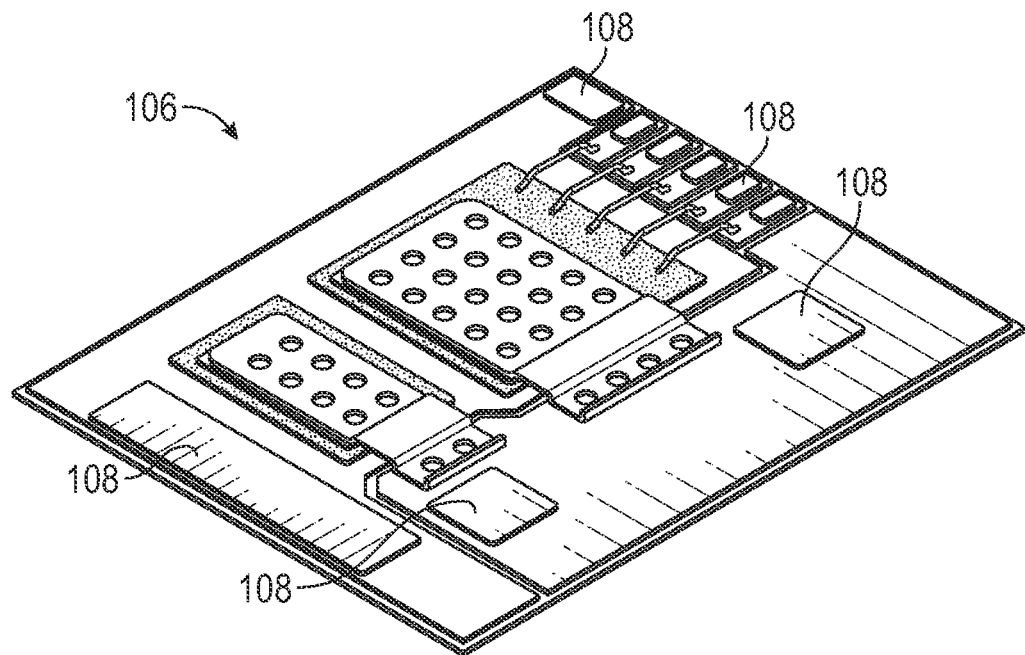
FIG. 15 is a top perspective view of an implementation of a second substrate after singulation.
Figure 16:
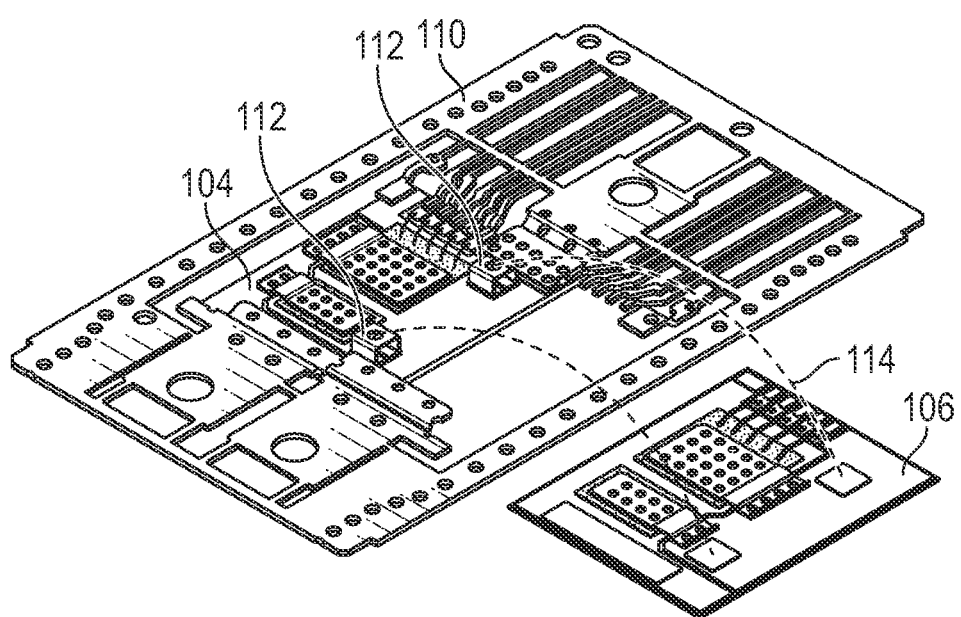
FIG. 16 is a top perspective view of an implementation of a first substrate coupled to a lead frame and a second substrate before coupling to the lead frame.

The method may also include dispensing solder onto a plurality of predetermined locations on the first side of each of the first substrates and the second substrates. In various implementations, the solder may be a low temperature solder. Referring to FIGS. 14 and 15, each of a first substrate 104 and a second substrate 106 is illustrated after dispensing solder in predetermined locations 108. The method may also include coupling a first substrate to a first side of a lead frame. The first side of the first substrate may be coupled to the lead frame through solder at the predetermined locations. The leads coupling with the first substrate may be formed towards the first side of the lead frame. Referring to FIG. 16, the lead frame is illustrated after coupling the first substrate 104 to the first side of the lead frame 110.

Figure 17:
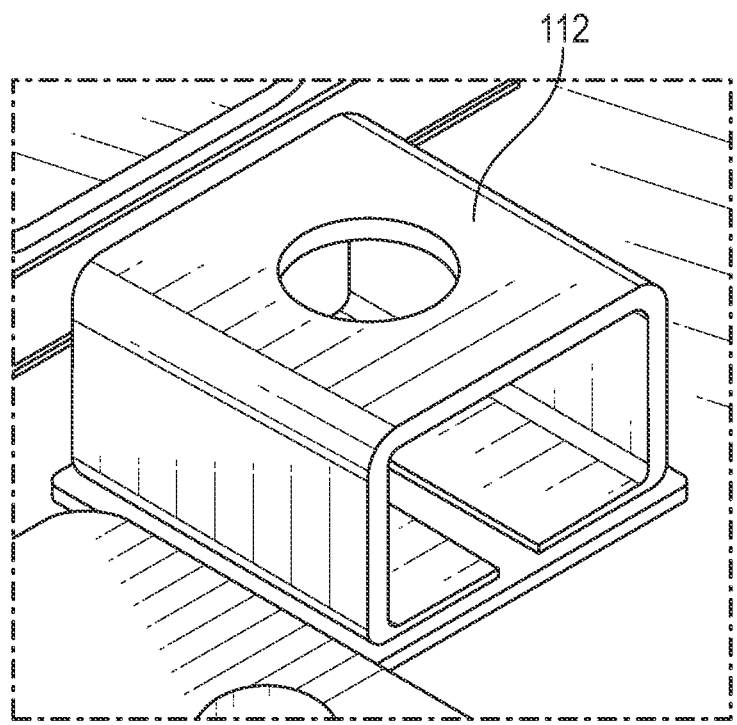
FIG. 17 is a close up view of an implementation of a spacer.

The method may also include coupling two or more spacers to a first side of the first substrate on the predetermined locations not coupled to the lead frame. The clips may be formed of electrically conductive material. The spacers may electrically couple the first substrate to the second substrate. Because the first substrate and the second substrates are coupled only through the spacers, there may be less stress on the components of the semiconductor package during assembly, reflow, and other processing steps of manufacturing. Still referring to FIG. 16, the two spacers 112 are illustrated coupled to a first side of the first substrate 104 through solder. An enlarged view of the spacer 112 is illustrated in FIG. 17. In various implementations, the spacers may be formed of electrically conductive material such as copper. The method also includes coupling a first side of a second substrate 106 to the two spacers and to the second side of the lead frame as illustrated by the dotted lines 114 in FIG. 16. The leads that couple with the second substrate are formed towards the second side of the lead frame.

Figure 18:
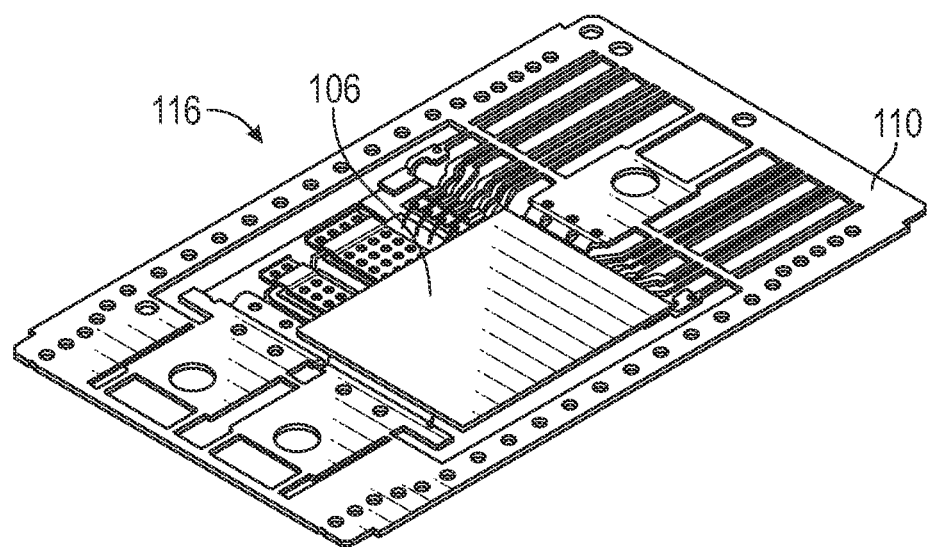
FIG. 18 is a top perspective view of an implementation of a second side of a lead frame after coupling of a second substrate thereto.
Figure 19:
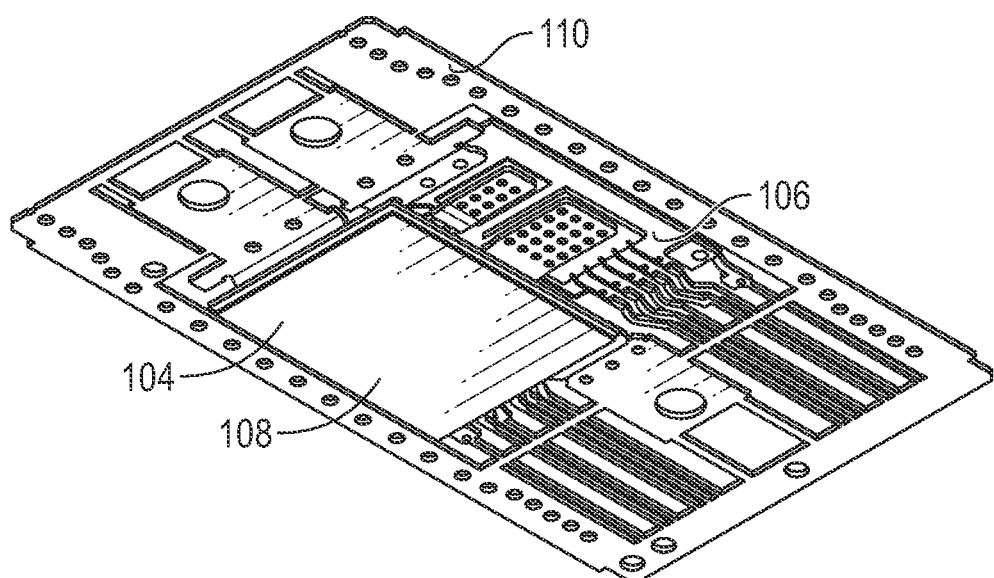
FIG. 19 is a top perspective view of an implementation of a first side of a lead frame.

Referring to FIG. 18, an implementation of a semiconductor package 116 after coupling of the first side of the second substrate 106 to the two spacers and to the second side of the lead frame 110 is illustrated. As illustrated, the first side of the first substrate and first side of the second substrate are asymmetrically coupled through the two spacers. This structure may place less stress on the internal components of the package. Referring to FIG. 19, a first side of the lead frame 110 is illustrated. The second side 118 of the first substrate 104 and a first side of the second substrate 106 is visible in this view. The second side of each of the first substrate and the second substrate are exposed to act as a heatsink for the semiconductor package.

Figure 20:
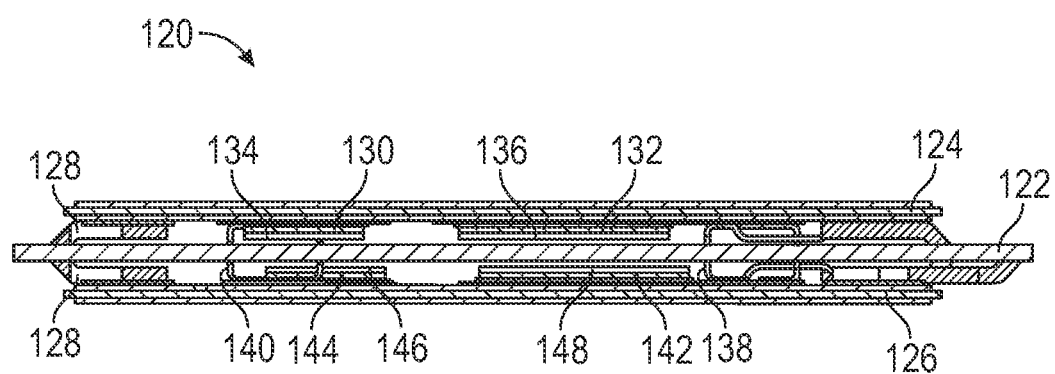
FIG. 20 is a side view of an implementation of a semiconductor package.

Referring to FIG. 20, a side view of a semiconductor package 120 is illustrated. In this view, the lead frame 122 is illustrated having the first substrate 124 coupled to a first side of the lead frame 122 and the second substrate 126 coupled to the second side of the lead frame 122. The first substrate 124 and the second substrate 126 are mechanically and electrically coupled to the lead frame 122 through leads 128 formed towards the respective substrates. The first substrate 124 has two die 130 and 132 coupled to the first side of the first substrate 124. Clips 134 and 136 are coupled to each of the two dies 130 and 132. The structure of the semiconductor package allows the clips to be coupled perpendicularly with the leads of the lead frame.

The semiconductor package also include spacers 138 and 140 that mechanically and electrically couple the first substrate 124 with the second substrate 126. The first side of the first substrate and first side of the second substrate are asymmetrically coupled through the two or more spacers. The second substrate 126 includes two die 142 and 144 coupled with the first side of the second substrate 126. Two clips 146 and 148 are coupled with the two die 142 and 144. Coupling the first substrate and the second substrate through the spacers asymmetrically may reduce stress on the clips and the die of the semiconductor package. Use of the lead frame and use of the spacers allows for a structure where the substrates and the die are not coupled in a stacked configuration.

Figure 21:
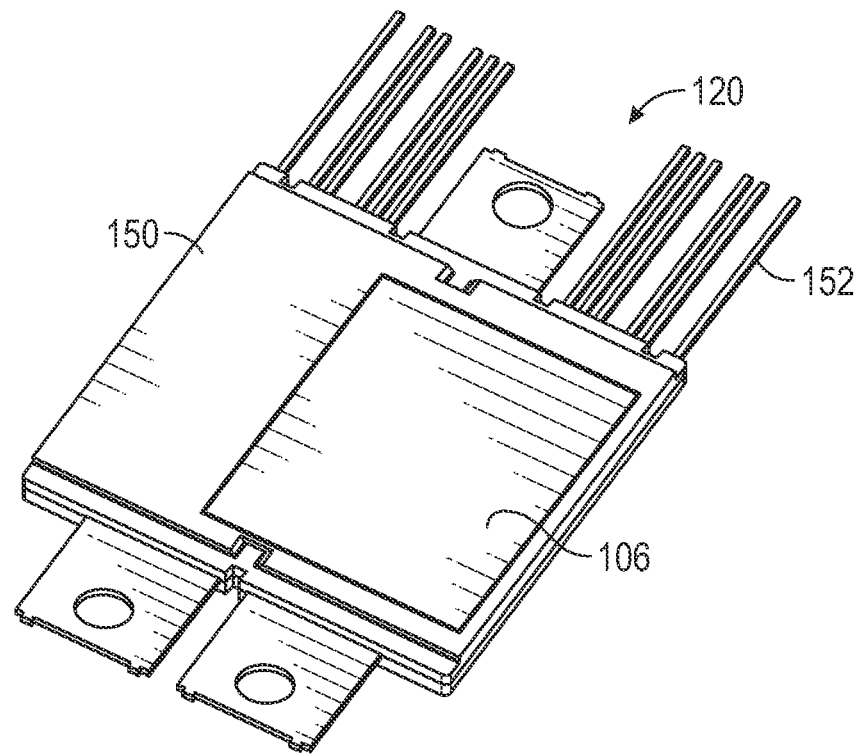
FIG. 21 is a top view of an implementation of a semiconductor package after encapsulation.
Figure 22:
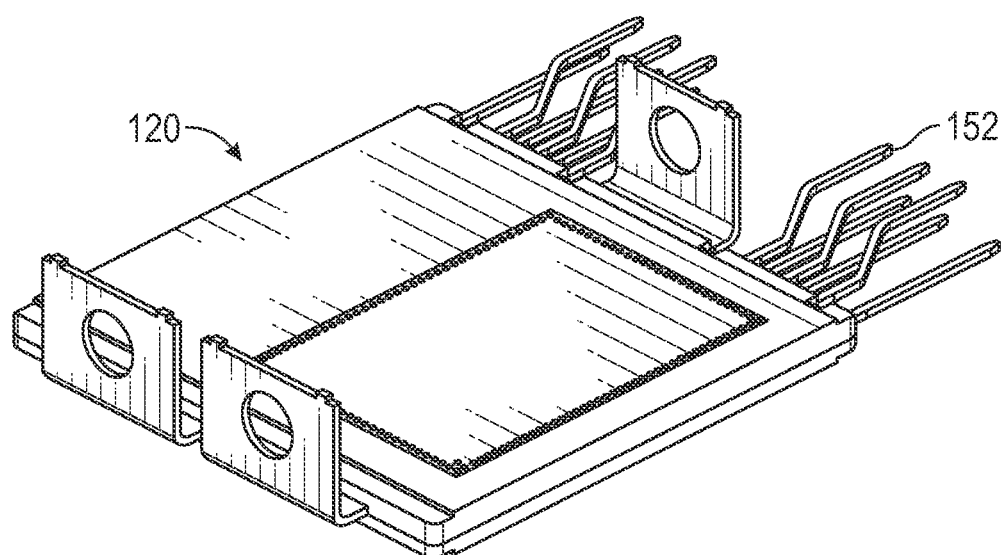
FIG. 22 is a perspective view of an implementation of a semiconductor package after lead trimming and formation.

The method of manufacturing a semiconductor package may also include encapsulating the lead frame on the first side and the second side. In various implementations, the packages may be encapsulated through transfer molding using epoxy molding compounds or through liquid processes using liquid encapsulants. The molding compounds may include, in various implementations, epoxies, resins, or other encapsulating materials. A second side of each of the first substrate and the second substrate 106 is exposed after encapsulation 150 as illustrated in FIG. 21. The structure of the semiconductor package 120 may also provide better mold flow during the molding process. The method may also include trimming and forming the leads 152 of the semiconductor package 120 to orient them in desired direction(s) as illustrated in FIG. 22. In various implementations, the method may also include coupling a heat sink to the second side of the first substrate, the second side of the second substrate, the second side of the first die, the second side of the second die, or any combination thereof.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
 a first die coupled to a first substrate through a first sintering material;
 a second die coupled to a second substrate through a second sintering material;
 a first clip coupled to the first die through a third sintering material;
 a second clip coupled to the second die through a fourth sintering material; and
 a spacer coupled between the first substrate and the second substrate, the spacer coupled directly to the first substrate and directly to the second substrate;
 wherein a perimeter of the first substrate only partially overlaps a perimeter of the second substrate and the perimeter of the second substrate only partially overlaps the perimeter of the first substrate when the first substrate and second substrate are coupled through the spacer.

2. The semiconductor package of claim 1, wherein only a portion of the first substrate is coupled directly under the second substrate and only a portion of the second substrate is coupled directly over the first substrate.

3. The semiconductor package of claim 1, wherein the first sintering material is directly coupled to and between the first substrate and the first die, the second sintering material is directly coupled to and between the second substrate and the second die, the third sintering material is directly coupled to and between the first die and the first clip, and the fourth sintering material is directly coupled to and between the second die and the second clip.

4. The semiconductor package of claim 1, further comprising a heat sink coupled with one of the first substrate, the second substrate, or any combination thereof.

5. The semiconductor package of claim 1, wherein the spacer is comprised of electrically conductive material and electrically couples the first substrate to the second substrate.

6. The semiconductor package of claim 1, wherein the first substrate is directly coupled to the first die through the first sintering material and is directly coupled to the first clip through the first sintering material.

7. A semiconductor package comprising:
 a lead frame;
 a first substrate mechanically and electrically coupled to a first side of the lead frame;
 a second substrate mechanically and electrically coupled to a second side of the lead frame;
 a spacer coupled to and between each of the first substrate and the second substrate;
 a first die coupled to the first substrate through a first sintering material;
 a second die coupled to the second substrate through a second sintering material;
 a first clip coupled to the first die through a third sintering material; and
 a second clip coupled to the second die through a fourth sintering material.

8. The semiconductor package of claim 7, further comprising a third die coupled to the first substrate through the first sintering material, a fourth die coupled to the second substrate through the second sintering material, a third clip coupled to the third die through the third sintering material, and a fourth clip coupled to the fourth die through the fourth sintering material.

9. The semiconductor package of claim 7, wherein the first clip is directly coupled to the first die through the third sintering material and is directly coupled to the first substrate through the first sintering material.

10. The semiconductor package of claim 7, further comprising a heat sink coupled with one of the first substrate or the second substrate.

11. The semiconductor package of claim 7, wherein the spacer is comprised of electrically conductive material and electrically couples the first substrate to the second substrate.

12. The semiconductor package of claim 7, wherein the first substrate and the second substrate comprise one of a direct bonded copper substrate (DBC), an insulated metal substrate technology (IMST) substrate, an active metal bonding (AMB) substrate, or any combination thereof.

13. A semiconductor package comprising:
a first substrate directly coupled to a spacer;
a second substrate directly coupled to the first substrate through the spacer;
a lead frame coupled between the first substrate and the second substrate;
a first clip coupled to the first substrate through a first sintering material; and
a second clip coupled to the second substrate through a second sintering material;
wherein the first substrate and the second substrate are asymmetrically coupled through the lead frame.

14. The semiconductor package of claim 13, wherein an outer edge of the first substrate extends beyond a perimeter of the second substrate and an outer edge of the second substrate extends beyond a perimeter of the first substrate.

15. The semiconductor package of claim 13, further comprising a first die coupled between the first substrate and the first clip and a second die coupled between the second substrate and the second clip.

16. The semiconductor package of claim 13, further comprising a heat sink coupled with one of the first substrate or the second substrate.

17. The semiconductor package of claim 13, wherein the spacer is comprised of electrically conductive material and electrically couples the first substrate to the second substrate.

18. The semiconductor package of claim 13, wherein the first substrate and the second substrate comprise one of a direct bonded copper substrate (DBC), an insulated metal substrate technology (IMST) substrate, an active metal bonding (AMB) substrate, or any combination thereof.

19. The semiconductor package of claim 13, wherein the first sintering material bonds the first substrate to the first clip and a first die and the second sintering material bonds the second substrate to the second clip and a second die.

20. The semiconductor package of claim 13, wherein a perimeter of a first side of the first substrate extends outside of a perimeter of a first side of the second substrate and the perimeter of the first side of the second substrate extends outside of the perimeter of the first side of the first substrate, wherein the first side of the first substrate faces the first side of the second substrate.

* * * * *